United States Patent
Suzuki

(10) Patent No.: US 6,414,478 B1
(45) Date of Patent: Jul. 2, 2002

(54) TRANSFER MECHANISM FOR USE IN EXCHANGE OF PROBE CARD

(75) Inventor: Masaru Suzuki, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 09/612,300

(22) Filed: Jul. 7, 2000

(30) Foreign Application Priority Data

Jul. 9, 1999 (JP) ............................................. 11-195245

(51) Int. Cl.⁷ ................................................ G01R 31/02
(52) U.S. Cl. .................................... 324/158.1; 324/754
(58) Field of Search ................................ 324/754, 755, 324/757, 758, 765, 158.1

(56) References Cited

U.S. PATENT DOCUMENTS

| | | | | |
|---|---|---|---|---|
| 5,254,939 A | * | 10/1993 | Anderson et al. | 324/754 |
| 5,444,386 A | * | 8/1995 | Mizumura | 324/754 |
| 6,107,813 A | * | 8/2000 | Sinsheimer et al. | 324/758 |

FOREIGN PATENT DOCUMENTS

| | | |
|---|---|---|
| JP | 62-169341 | 7/1987 |
| JP | 62-128631 | 8/1987 |
| JP | 63-107136 | 5/1988 |
| JP | 3-220472 | 9/1991 |
| JP | 3-220742 | 9/1991 |
| JP | 8-139141 | 5/1996 |

* cited by examiner

*Primary Examiner*—Michael J. Sherry
*Assistant Examiner*—Russell M. Kobert
(74) *Attorney, Agent, or Firm*—Oblon, Spivak, McClelland, Maier & Neustadt, P.C.

(57) ABSTRACT

A probe card transfer mechanism, in which a chuck top is used as a main transfer mechanism, comprises a passing and receiving mechanism for passing or receiving a probe card to or from the chuck top. The passing and receiving mechanism has an adapter for detachably holding the probe card having, for example, a card holder, a transfer tray for detachably holding the adapter, a pair of guide rails for guiding the transfer tray to a probe card passing and receiving position, an arm to which the guide rails are fixed, and a probe card supporting member for receiving the adapter conveyed together with the transfer tray along the arm. The probe card supporting member is provided around the chuck top. A distal end portion of the transfer tray is U-shaped. The transfer tray is mounted on the U-shaped portion.

12 Claims, 3 Drawing Sheets

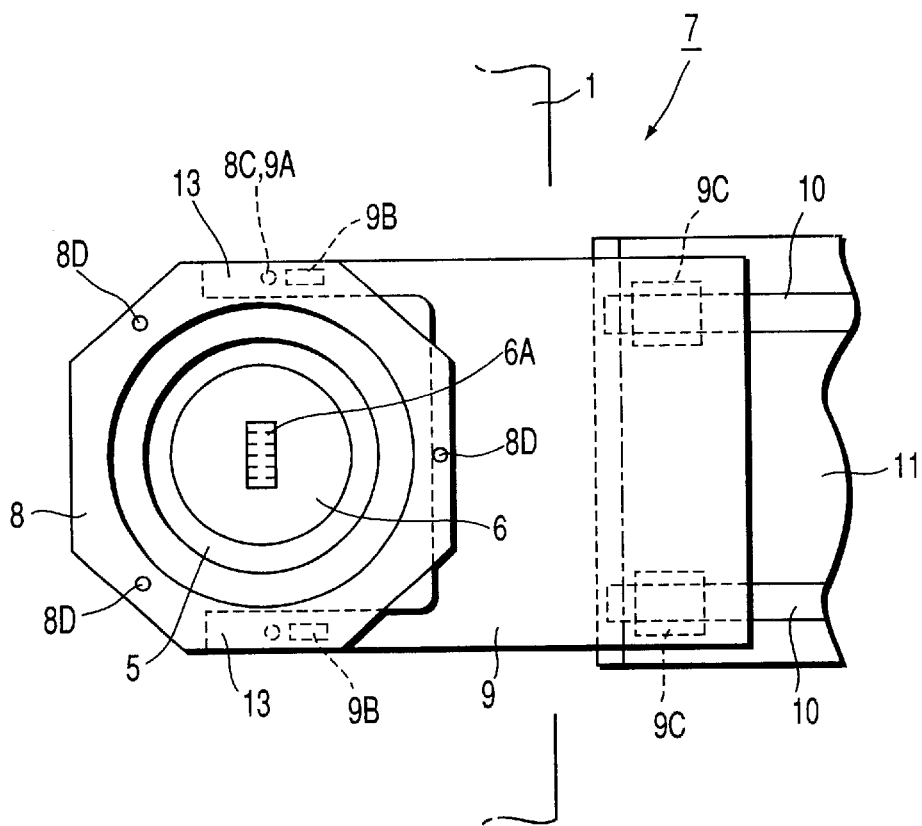
F I G. 2A
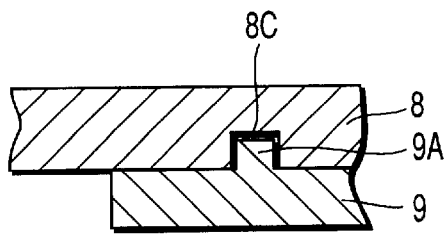
F I G. 2B
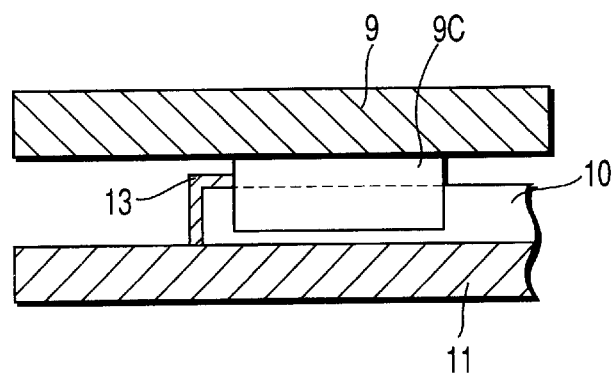
F I G. 2C

TRANSFER MECHANISM FOR USE IN EXCHANGE OF PROBE CARD

CROSS-REFERENCE TO RELATED APPLICATIONS

This application is based upon and claims the benefit of priority from the prior Japanese Patent Application No. 11-195245, filed Jul. 9, 1999, the entire contents of which are incorporated herein by reference.

BACKGROUND OF THE INVENTION

The present invention relates to a probe card transfer mechanism for use in an exchange of a probe card of a probe apparatus with another, and more specifically, to a simple probe card transfer mechanism which has a low cost.

In general, a probe apparatus has a load chamber and a probe chamber. In the load chamber, an object to be tested (e.g., a semiconductor wafer) is pre-aligned while being conveyed. In the probe chamber, an electric characteristic of the object transferred from the load chamber is tested. The load chamber has an object transfer mechanism and a pre-alignment mechanism.

The object is pre-aligned while being conveyed in the load chamber, and then transferred to the probe chamber.

The probe chamber has a chuck top on which the object is to be placed, an alignment mechanism, and a probe card. When the chuck top is loaded with the wafer, it is moved in directions X, Y, Z and θ, and aligned with the probe card. After the alignment, the chuck top is moved up such that a probe needle of the probe card can be accurately brought into electrical contact with a measurement electrode of the object on the chuck. The object is connected to a tester via the probe needle, so that the electrical characteristic thereof can be tested.

It is necessary to exchange a probe card with another one in accordance with the type of object to be tested. The probe cards are exchanged by a probe card exchanging apparatus. For example, Jpn. Pat. Appln. KOKOKU Publication No. 5-67060 and Jpn. Pat. Appln. KOKAI Publication No. 3-220472 propose a full-automatic exchanging apparatus for fully automatically exchanging probe cards.

Recently, as semiconductor wafers (one of the objects to be tested) are becoming wider in diameter and highly integrated, the construction cost of factories for manufacturing semiconductors has increased remarkably. Under the circumstances, reduction in cost of semiconductor manufacturing apparatuses has been required. The probe apparatus is not an exception. Therefore, cost reduction of the probe apparatus has been promoted by simplifying the structure and saving space, as well as in the case of the other semiconductor manufacturing apparatuses. From this viewpoint, the fully automatic exchanging apparatus requires a storage section for storing a plurality of probe cards together and a transfer mechanism for transferring the storage section to the chuck top. For this reason, since the exchanging apparatus of this type has a complicated mechanism and requires space for the purpose of exchange only, it tends to be expensive. The applicant of the present invention proposed a semi-automatic exchanging apparatus in, for example, Jpn. Pat. Appln. KOKAI Publication No. 8-139141. The exchanging apparatus of this type had a simple mechanism, promoted space saving and realized cost reduction.

In the probe card exchanging apparatus proposed in Jpn. Pat. Appln. KOKAI Publication No. 8-139141, since the probe card storage section can be omitted, space can be saved and the cost can be reduced as compared to the fully automatic exchanging apparatus. However, the exchanging apparatus proposed in the above publication requires a probe card transfer mechanism. The probe card transfer mechanism uses a driving mechanism including a motor and an actuator to drive an arm for transferring a probe card placed thereon. The driving mechanism is complicated and expensive. This is a problem of the above probe card exchanging apparatus.

BRIEF SUMMARY OF THE INVENTION

The present invention was made to solve the problem described above.

An object of the present invention is to provide a probe card transfer mechanism in which extra driving mechanisms, essentially unnecessary for a probe apparatus, are reduced to a minimum, so that the mechanism and structure can be simplified and the cost can be reduced.

According to a first aspect of the present invention, there is provided a probe card transfer mechanism comprising:
  a probe card attachment mechanism, provided in a probe apparatus main body, for detachably holding a probe card having a plurality of probe needles and a card holder;
  a chuck top, provided in the probe apparatus main body and movable in directions X, Y, Z and θ, the chuck top having a function of bringing an object to be tested into contact with the probe needles of the probe card in a state where the object is mounted thereon, and a function of transferring the probe card to and from the probe card attachment mechanism in a state where the probe card is mounted thereon;
  a probe card supporting member, attached to a side surface of the chuck top, for detachably supporting the probe card separated from the chuck top, so that the probe needles may not be in contact with a main surface of the chuck top; and
  a passing and receiving mechanism for passing or receiving the probe card between the probe card supporting member and outside of the probe apparatus main body.

In the probe card transfer mechanism, it is preferable that the passing and receiving mechanism include an adapter for detachably holding the probe card.

In the probe card transfer mechanism, it is preferable that the passing and receiving mechanism further include a transfer tray for detachably holding the adapter holding the probe card, and a guide mechanism for guiding the transfer tray from outside of the probe apparatus main body to inside thereof.

In the probe card transfer mechanism, it is preferable that the transfer tray include an adapter holding section having a U-shaped opening in its distal end portion, and that the chuck top be lifted up through the U-shaped opening of the adapter holding section, so that the adapter is received by the probe card supporting member attached to the chuck top from the adapter holding section.

In the probe card transfer mechanism, it is preferable that the guide mechanism be rotatably attached to the probe apparatus main body so as to be set in a horizontal state and a vertical state.

In the probe card transfer mechanism, it is preferable that the probe card supporting member include a suction mechanism for holding the adapter by means of suction force.

According to a second aspect of the present invention, there is provided a probe card transfer mechanism comprising:

an insert ring, provided in a probe apparatus main body, for detachably holding a probe card having a plurality of probe needles;

an adapter for detachably holding the probe card;

a chuck top, on which a semiconductor wafer is to be mounted, the chuck top being movable in directions X, Y, Z and θ in the probe apparatus main body and having a function of bringing the semiconductor wafer into contact with the probe needles of the probe card and a function of transferring the probe card between the insert ring and the transfer tray;

a probe card supporting member, attached to a side surface of the chuck top, for detachably supporting the adapter holding the probe card, so that the probe needles may not be in contact with a main surface of the chuck top; and a passing and receiving mechanism for passing or receiving the adapter between the probe card supporting member and outside of the probe apparatus main body, the passing and receiving mechanism comprising:

a transfer tray for detachably holding the adapter holding the probe card;

an arm attached to the probe apparatus main body; and a guide rail, fixed to the arm, for guiding movement of the transfer tray from outside of the probe apparatus main body to inside thereof.

In the probe card transfer mechanism, it is preferable that the arm be pivotally attached to the probe apparatus main body so as to be set in a horizontal state and a vertical state.

In the probe card transfer mechanism, it is preferable that the transfer tray have a sensor for detecting existence of the adapter.

In the probe card transfer mechanism, it is preferable that the probe card supporting member have a suction mechanism for holding the adapter by means of suction force.

In the probe card transfer mechanism, it is preferable that the probe card supporting member have a sensor for detecting existence of the probe card.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A, 2B and 2C are diagrams showing a passing and receiving mechanism illustrated in FIG. 1, in which FIG. 2A is a plan view, FIG. 2B is a cross-sectional view of a member for positioning an adapter and a transfer tray, and FIG. 2C is a cross-sectional view showing the relationship between the transfer tray and a guide rail;

DETAILED DESCRIPTION OF THE INVENTION

The present invention will be described on the basis of an embodiment shown in FIGS. 1 to 4. A probe card transfer mechanism of the present invention can be employed in probe apparatuses for testing various objects, including semiconductor wafers. However, to explain the present invention more clearly, a probe card transfer mechanism used in a probe apparatus for testing a semiconductor wafer will be described below.

Figure 1:
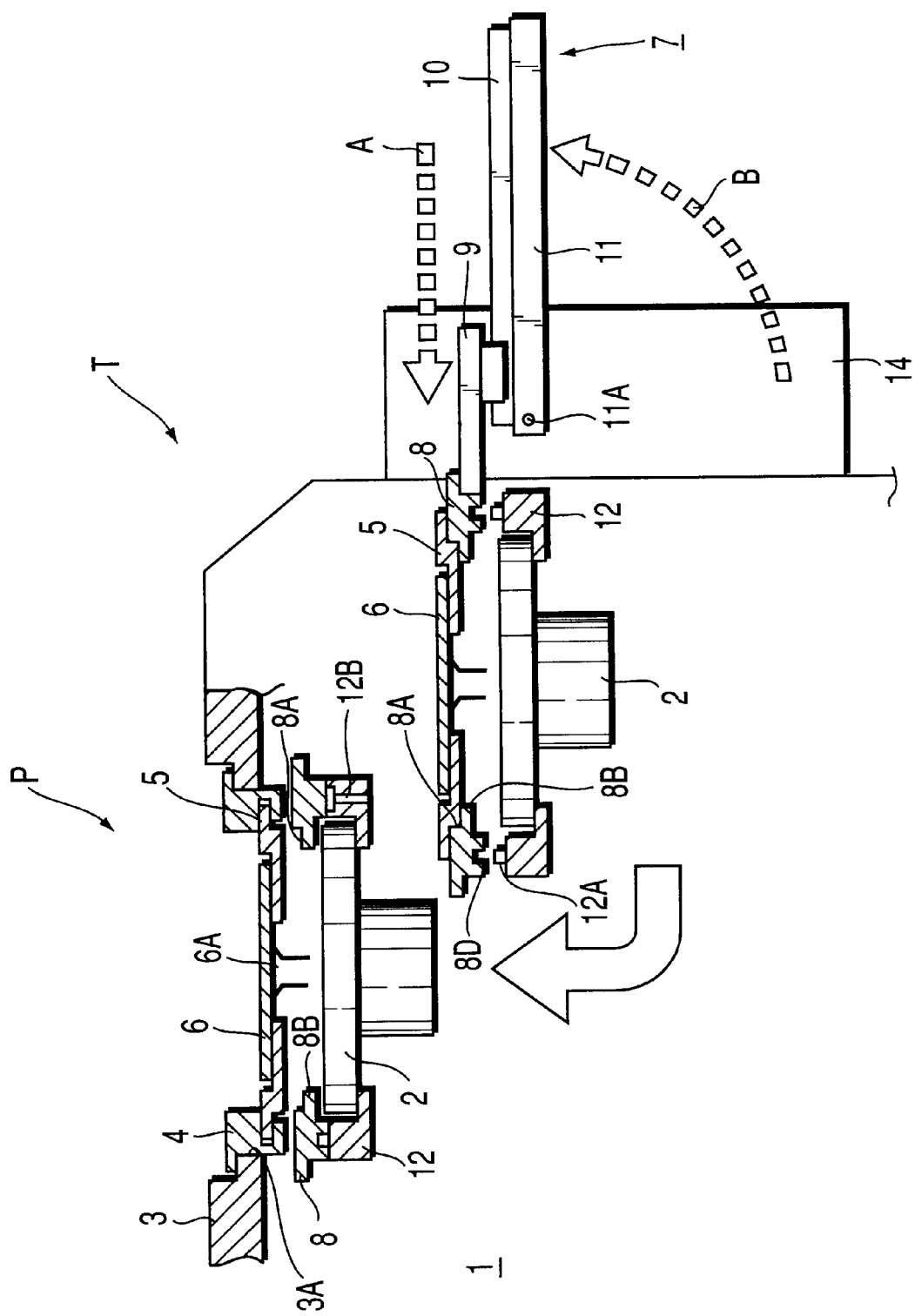
FIG. 1 is a side view for explaining an operation of a probe card transfer mechanism according to an embodiment of the present invention.

FIG. 1 shows a probe apparatus P to which a probe card transfer mechanism T of the present invention (hereinafter referred to as "the transfer mechanism" is applied. The probe apparatus P has a probe chamber 1 including a chuck top 2 on which an object (wafer) is to be placed, a probe card attachment mechanism (e.g., an insert ring) 4, and a probe card 6. The chuck top 2 is movable in directions X, Y, Z and θ. The probe card attachment mechanism 4 is fixed to an opening 3A formed in a substantially central portion of a head plate 3 above the chuck top 2. The probe card 6 is detachably attached to the probe card attachment mechanism 4 via a card holder 5.

A load chamber (not shown) is adjacent to the probe chamber 1. The wafer transferred from the load chamber is placed on the chuck top 2 in the probe chamber 1. In the probe chamber 1, the chuck top 2 is moved in the directions X, Y, Z and θ, so that a probe needle 6A of the probe card 6 can be aligned with a measuring electrode on the wafer in cooperation with an alignment mechanism (not shown). Thereafter, the chuck top 2 is indexed, so that electrical characteristics of the IC chips formed on the wafer can be tested.

As shown in FIGS. 1 and 2A to 2C, the transfer mechanism T of this embodiment comprises the chuck top 2 movable in the directions X, Y, Z and θ in the probe chamber 1, and a passing and receiving mechanism 7 for passing or receiving the probe card 6 to or from the chuck top 2. The chuck top 2 receives the probe card 6 from the passing and receiving mechanism 7 and transfers it to the insert ring 4. It is preferable that the probe card 6 have the card holder 5. The card holder 5 may have such a structure as to be attached to the probe card 6 by fixing means (e.g., screws), or may be formed integrally with the probe card 6.

The passing and receiving mechanism 7 has an adapter 8 for detachably holding the probe card 6; a transfer tray 9 detachably holding the adapter 8; an arm 11 to which guide rails 10 for guiding the transfer tray 9 to a passing and receiving position are fixed; and a probe card supporting member 12 for receiving the probe card 6 and the adapter 8 held on the transfer tray 9 moving on the arm 11. The transfer tray 9 has in its distal end portion a U-shaped (fork-shaped) adapter holding section 13 (FIG. 2A). In a case where no adapter is employed, the transfer tray 9 holds the probe card 6 via the card holder 5. An engaging section 9C (e.g., a linear guide) may be employed as means for moving the transfer tray 9 along the guide rails 10. Although a single guide rail may be used to guide the transfer tray 9, it is preferable that a plurality of (a pair of) rails be used. The probe card supporting member 12 is preferably attached to a side surface of the chuck top 2. It is preferable that the probe card supporting member 12 be supported at three portions of the adapter 8 to stably hold the adapter 8.

The probe card 6 attached to the card holder 5 is fitted to a central portion of the adapter 8 as shown in FIGS. 1 and 2A, when it is initially attached to the probe apparatus P or exchanged with another card. The card holder 5 is fitted into a recess 8A formed in the central portion of the adapter 8. A central hole 8B, through which the probe needle 6A is passed, is formed in a central portion of the recess 8A. The adapter 8 has a first guide hole 8C formed in the rear surface thereof. As shown in FIG. 2B, a guide pin 9A provided on the main surface of the transfer tray 9 is engaged with the first guide hole 8C. The adapter 8 is positioned to and supported by the transfer tray 9 at a fixed position by means of the first guide hole 8C and the guide pin 9A. As shown in FIG. 2A, a proximity sensor 9B is provided near the guide pin 9A. The proximity sensor 9B detects whether the adapter 8 is present on the transfer tray 9.

Preferably, two engaging sections 9C to be engaged with the pair of guide rails 10 are provided on the rear surface of a proximal end portion of the transfer tray 9, as shown in FIGS. 1 and 2A. The transfer tray 9 is moved by a manual operation along the arm 11 in the direction indicated by the arrow A, and pushed into the probe chamber 1. The transfer tray is drawn out of the probe chamber through the pushed position. As shown in FIG. 2C, stoppers 13 are formed on the guide rails 10 in a distal end portion of the arm 11. The transfer tray 9 is stopped at a predetermined position by the stoppers 13. As a result, the probe card 6 transferred by the transfer tray 9 is pushed to a fixed position (where the probe card is passed to or received from the chuck top) in the probe chamber 1. Stoppers are also formed on the guide rails 10 in a proximal end portion of the arm 11. These stoppers prevent the transfer tray 9 from slipping off from the guide rails 10.

As shown in FIG. 1, a proximal end portion of the arm 11 is pivotally supported by a shaft 11A to a front wall (the right side in FIG. 1) of the probe chamber 1. The proximal end portion of the arm 11 can be attached to the wall of the probe chamber 1 by various means other than the pivotal structure using the shaft 11A, for example, a hinge structure. The arm 11 can be rotated up from a vertical state to a horizontal state as indicated by the arrow B in FIG. 1. The arm 11 is locked at the rotated-up state and held horizontally. The arm 11 is stored in a casing 14 in the vertical state. Therefore, the transfer tray 9 and the arm 11 is normally stored in the casing 14.

Figure 3:
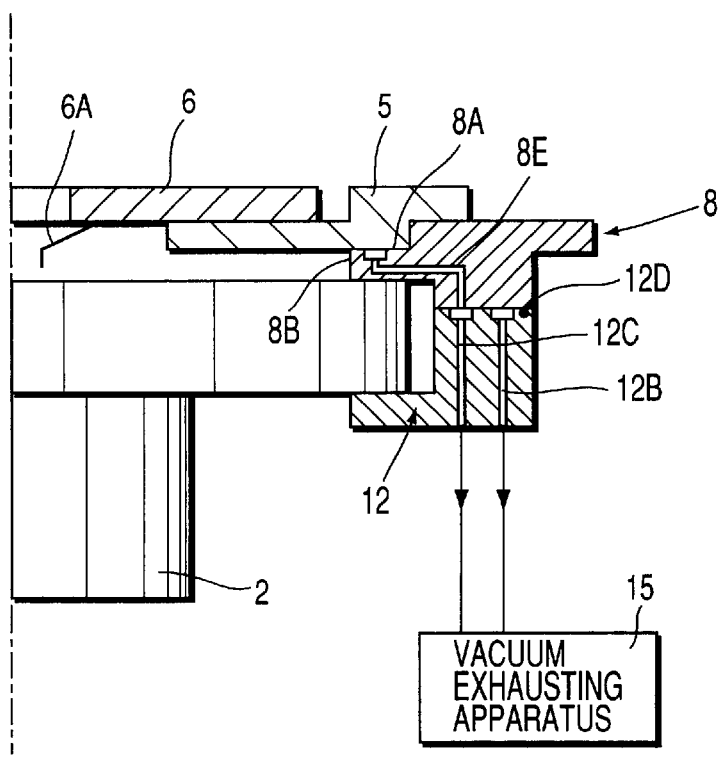
FIG. 3 is a cross-sectional view of the right half of the structure illustrated in FIG. 1, showing the relationship among the chuck top, the probe card supporting member, the card holder and the probe card.

It is preferable that, for example, three probe card supporting members 12 be provided at regular intervals along the circumferential direction around the chuck top 2, shown in FIGS. 1 and 3. The three probe card supporting members 12 support the adapter 8 which holds the probe card 6. The probe card supporting members 12 may be either constructed as a ring-like coupled structure or independent members. In the case where no adapter is employed, the probe card supporting members 12 can directly support the probe card 6. As shown in FIG. 3, it is preferable that the probe card supporting members 12 project outward from the circumferential surface of the chuck top 2, and that the main surfaces thereof be slightly lower than the main surface of the chuck top 2. As shown in FIG. 1, a guide pin 12A is formed on the main surface of the probe card supporting member 12. A second guide hole 8D corresponding to the guide pin 12A is formed in the rear surface of the adapter 8. The guide pin 12A and the second guide hole 8D ensure that the adapter 8 is supported by the probe card supporting member 12 without positional deviation. The recess 8A of the adapter 8 has such a height that the lower end of the probe needle 6A does not brought into contact with the main surface of the chuck top 2, when the probe card 6 is held in the recess 8A.

As show in FIG. 3, it is preferable that the probe card supporting member 12 have, for example, first and second exhaust paths 12B and 12C for exhausting air. The first and second paths 12B and 12C are connected to a vacuum exhausting apparatus 15. In FIG. 3, the first and second paths 12B and 12C extend in the vertical direction. However, they may have various shapes depending on the position of the vacuum exhausting apparatus, etc. Preferably, the adapter 8 has a through hole 8E corresponding to the second path 12C. The lower end of the through hole 8E coincides with the position of the second path 12C of the probe card supporting member 12. The upper end of the through hole 8E opens in the recess 8A. Further, the rear surface of the adapter 8 and the main surface of the probe card supporting member 12 are mirror-finished, so that the adapter 8 closely contacts to the main surface of the probe card supporting member 12.

In a state where the adapter 8 is supported by the probe card supporting member 12, it is vacuum-sucked to the main surface of the probe card supporting member 12 by the vacuum exhausting apparatus through the first path 12B connected thereto. The card holder 5 is vacuum-sucked to the recess 8A of the adapter 8 through the second path 12C and the through hole 8E. Whether the card holder 5 (the probe card 6) exists on the adapter 8 can be detected by detecting a pressure fluctuation during the vacuum exhaustion through the second path 12C and the through hole 8E. The total weight of the probe card 6 and the card holder 5 may exceed 10 kg. Therefore, when the probe card 6 is exchanged together with the card holder 5, the conventional structure of receiving the probe card by elevating three pins from the surface of the chuck top 2 cannot hold the probe card. According to the embodiment of the present invention, the problem of the conventional structure is solved by employing the probe card supporting member 12 mounted around the chuck top.

The chuck top 2 is moved to the probe card passing and receiving position under the control of the probe apparatus P. In this movement, the guide pin 12A of the probe card supporting member 12 is positioned to coincide with the second guide hole 8D of the adapter 8 transferred by the transfer tray 9. The U shape of the transfer tray 9 has an internal width which allows passage of the chuck top 2.

An operation of the transfer mechanism will now be described. To mount the probe card 6 on the probe card attachment mechanism (e.g., insert ring) 4, the arm 11 is rotated up to the horizontal as indicated by the arrow B (FIG. 1). The adapter 8 is fitted to the transfer tray 9 with the guide pin 9A of the transfer tray 9 engaged with the first guide hole 8C of the adapter 8. The probe card 6 attached to the card holder is fitted to the transfer tray 9 with the guide pin 9A engaged with the first guide hole 8C. During this operation, the chuck top 2 is moved to the probe card passing and receiving position under the control of the probe apparatus P. In this time, the probe card supporting member 12 is oriented so that it can receive or pass the adapter 8 from or to the transfer tray 9.

In this state, the transfer tray 9 is pushed by a manual operation into the probe chamber 1 in the direction indicated by the arrow A in FIG. 1 to position the adapter 8 directly above the chuck top 2. As the chuck top 2 is lifted up, the guide pin 12A of the probe card supporting member 12 is inserted into the second guide hole 8D of the adapter 8. The chuck top 2 is lifted up through the U-shaped opening portion of the tray 9, with the result that the probe card 6 attached to the card holder is lifted up from the transfer tray 9 together with the adapter 8.

In this time, when the air is exhausted by the vacuum exhausting apparatus 15 through the first and second paths 12B and 12C, the adapter 8 is sucked to the first path 12B. As a result, the adapter 8 is attracted and fixed to the main surface of the probe card supporting member 12. At the same time, the card holder S is sucked to the second path 12C, so that the probe card 6 is adhered to the recess 8A of the adapter 8 via the card holder 5. Whether the probe card 6 exists on the probe card supporting member 12 is confirmed by detecting the suction force.

Then, the chuck top 2 is moved from the passing and receiving position to a position directly under the insert ring 4, as shown in FIG. 1. Further, the chuck top 2 is lifted up, so that the card holder 5 is inserted into the insert ring 4. The card holder 5 and the probe card 6 are fixed to the insert ring 4.

After the probe card 6 is fitted to the insert ring 4, the chuck top 2 is lowered. At this time, the second path 12C and the through hole 8E are vacuumed. If the degree of vacuum in the path 12C is not reduced by lowering the chuck top 2, it is confirmed that the card holder 5 remains on the adapter 8 and the probe card 6 has not been fitted to the insert ring 4.

Thereafter, the chuck top 2 is returned to the side of the passing and receiving mechanism 7. At this time, the proximity sensor 9B detects that the adapter 8 exists on the transfer tray 9. Then, the vacuum exhausting apparatus is stopped and the pressure in the second path 12C is returned to a normal atmospheric pressure. The chuck top 2 is lowered, the adapter 8 is transferred to the transfer tray 9, and the transfer tray 9 is drawn out by a manual operation. Thus, the attachment of the probe card 6 is completed. Thereafter, the arm 11 is rotated down and stored in the casing 14.

When the probe card 6 is exchanged with another, the arm 11 is set to the horizontal. The adapter 8 is fitted to the transfer tray 9, which is pushed by the manual operation to the position directly above the chuck top 2. The chuck top 2 is lifted up, so that the probe card supporting member 12 receives the adapter 8. The adapter 8 is fixed to the probe card supporting member 12 by suction force generated by the vacuum exhausting apparatus 15. The chuck top 2 is moved to the position directly under the insert ring 4, and lifted up from this position to the probe card passing and receiving position. The probe card 6 is released from the insert ring 4 and mounted on the recess 8A of the adapter 8 together with the card holder 5. At this time, due to a negative pressure in the second path 12C and the through hole 8E, the card holder 5 and the probe card 6 are sucked to the adapter 8. As a result, the degree of vacuum in the second path 12C is increased. If the degree of vacuum is not increased, it is determined that the probe card 6 is not successfully passed to the adapter 8. In this case, the passing operation is carried out again, so that the probe card 6 is successfully received by the adapter 8. When the probe card 6 is received by the adapter 8, the chuck top 2 is returned to the position of the transfer tray 9 and the probe card 6 is passed to the transfer tray 9 along with the adapter 8. The transfer tray 9 is drawn out by the manual operation and the probe card is replaced by a new one.

Subsequently, the new probe card is attached to the insert ring 4 in the same manner as described first.

Figure 4:
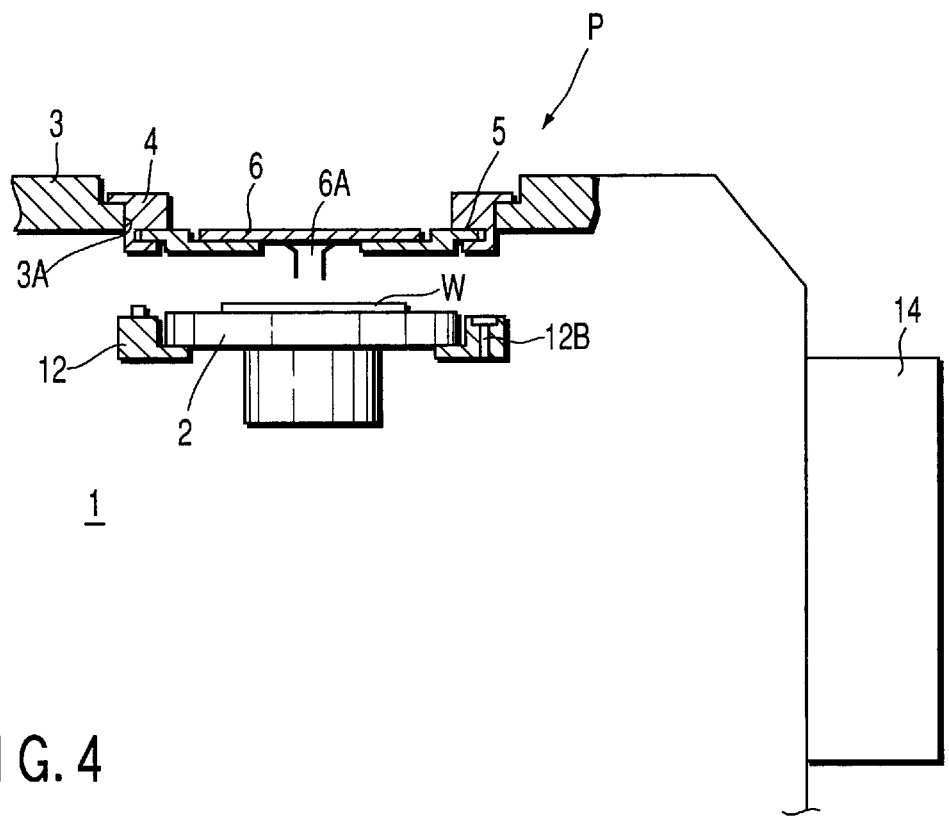
FIG. 4 is a cross-sectional view showing a state in which the chuck top loaded with a wafer is approaching the probe card in a test time.

After the probe card 6 is attached to the insert ring 4, the chuck top 2 loaded with the wafer W as shown in FIG. 4 is moved in the directions X, Y, Z and θ, and aligned with the probe card. After the alignment, the chuck top is moved up toward the probe card, such that a probe needle of the probe card can be accurately brought into electrical contact with a measurement electrode of the wafer W on the chuck. In this state, the electrical characteristic of the wafer W is tested.

As described above, in the probe apparatus of the present invention, the probe chamber 1 includes the chuck top 2 movable in the directions X, Y, Z and θ and the passing and receiving mechanism 7 for passing or receiving the probe card 6 to or from the chuck top 2. The passing and receiving mechanism 7 comprises the adapter 8 for detachably holding the probe card 6, the transfer tray 9 for detachably holding the adapter 8, the arm 11 to which the guide rails 10 for guiding the transfer tray 9 to the passing and receiving position are fixed, and the probe card supporting member 12 provided around the chuck top 2. According to the present invention, the probe card 6 is transferred by means of the chuck top 2. The mechanism 7 for passing or receiving the probe card to or from the chuck top does not have a driving mechanism. Therefore, it has a very simple structure, requires no extra space, and achieves considerable cost reduction.

According to the present invention, it is possible to detect by means of the proximity sensor 9B whether the adapter 8 is surely fitted to the transfer tray 9. It is possible to detect whether the adapter 8 is reliably supported by the probe card supporting member 12 by detecting the degree of vacuum in the first path 12B formed in the probe card supporting member 12. In addition, even if the probe card 6 is heavy, the adapter 8 can be reliably supported by the prove card supporting member 12. It is possible to detect whether the probe card is received by the insert ring 4 by detecting the degree of vacuum in the second path 12C formed in the probe card supporting member 12.

The present invention is not limited to the above embodiment, but the structural elements can be modified, if necessary.

According to the present invention, since a driving mechanism, essentially unnecessary for the probe apparatus, is not used, the mechanism and structure can be simplified and the cost can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probe card transfer mechanism comprising:
a probe card attachment mechanism, provided in a probe chamber, for detachably holding a probe card having a plurality of probe needles and a card holder;
a chuck top, provided in the probe chamber and movable in directions X, Y, Z and θ, the chuck top having a function of bringing an object to be tested into contact with the probe needles of the probe card in a state where the object is mounted thereon, and a function of transferring the probe card to and from the probe card attachment mechanism in a state where the probe card is mounted thereon;
a probe card supporting member, attached to a side surface of the chuck top, for detachably supporting the probe card separated from the chuck top, so that the probe needles may not be in contact with a main surface of the chuck top; and a passing and receiving mechanism, including at least one stopper located in the probe chamber, for passing or receiving the probe card between the probe card supporting member and outside of the probe chamber at a predetermined position determined by the stopper.

2. The probe card transfer mechanism according to claim 1, wherein the passing and receiving mechanism includes an adapter configured to hold detachably the probe card.

3. The probe card transfer mechanism according to claim 2, wherein the passing and receiving mechanism further includes a transfer tray for detachably holding the adapter holding the probe card, and a guide mechanism for guiding the transfer tray from outside of the probe chamber to inside thereof.

4. The probe card transfer mechanism according to claim 3, wherein the transfer tray includes an adapter holding section having a U-shaped opening in its distal end portion, and the chuck top is lifted up through the U-shaped opening of the adapter holding section, so that the adapter is received by the probe card supporting member attached to the chuck top from the adapter holding section.

5. The probe card transfer mechanism according to claim 3, wherein the guide mechanism is rotatably attached to the probe chamber so as to be set in a horizontal state and a vertical state.

6. The probe card transfer mechanism according to claim 3, wherein the probe card supporting member includes a suction mechanism for holding the adapter by suction force.

7. The probe card transfer mechanism according to claim 1, wherein the probe card supporting member has a suction mechanism for holding the adapter by means of suction force.

8. A probe card transfer mechanism comprising:

an insert ring, provided in a probe chamber, for detachably holding a probe card having a plurality of probe needles;

an adapter for detachably holding the probe card;

a chuck top, on which a semiconductor wafer is to be mounted, the chuck top being movable in directions X, Y, Z and θ in the probe chamber and having a function of bringing the semiconductor wafer into contact with the probe needles of the probe card and a function of transferring the probe card between the insert ring and the transfer tray;

a probe card supporting member, attached to a side surface of the chuck top, for detachably supporting the adapter holding the probe card, so that the probe needles may not be in contact with a main surface of the chuck top; and a passing and receiving mechanism for passing or receiving the adapter between the probe card supporting member and outside of the probe chamber, the passing and receiving mechanism comprising:

a transfer tray for detachably holding the adapter holding the probe card;

an arm attached to the probe chamber; and a guide rail, fixed to the arm, for guiding movement of the transfer tray from outside of the probe chamber to inside thereof.

9. The probe card transfer mechanism according to claim 8, wherein the arm is pivotally attached to the probe chamber so as to be set in a horizontal state and a vertical state.

10. The probe card transfer mechanism according to claim 3 or 9, wherein the transfer tray has a sensor for detecting existence of the adapter.

11. The probe card transfer mechanism according to claim 10, wherein the probe card supporting member has a suction mechanism for holding the adapter by means of suction force.

12. The probe card transfer mechanism according to claim 10, wherein the probe card supporting member has a sensor for detecting existence of the probe card.

* * * * *